(12) United States Patent
Werner et al.

(10) Patent No.: US 7,880,224 B2
(45) Date of Patent: Feb. 1, 2011

(54) SEMICONDUCTOR COMPONENT HAVING DISCONTINUOUS DRIFT ZONE CONTROL DIELECTRIC ARRANGED BETWEEN DRIFT ZONE AND DRIFT CONTROL ZONE AND A METHOD OF MAKING THE SAME

(75) Inventors: Wolfgang Werner, Munich (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 442 days.

(21) Appl. No.: 12/019,750

(22) Filed: Jan. 25, 2008

(65) Prior Publication Data
US 2009/0189216 A1 Jul. 30, 2009

(51) Int. Cl.
*H01L 29/76* (2006.01)
*H01L 21/336* (2006.01)

(52) U.S. Cl. .............. 257/329; 257/328; 257/342; 257/E29.257; 257/E21.418; 438/268; 438/273

(58) Field of Classification Search .............. 257/328, 257/329, 342, E29.257, E21.418; 438/212, 438/218, 268, 273, 296
See application file for complete search history.

(56) References Cited

U.S. PATENT DOCUMENTS

| | | | |
|---|---|---|---|
| 5,844,272 A | 12/1998 | Soederbaerg et al. | |
| 6,201,279 B1* | 3/2001 | Pfirsch | 257/333 |
| 6,452,230 B1* | 9/2002 | Boden, Jr. | 257/341 |
| 6,608,350 B2* | 8/2003 | Kinzer et al. | 257/341 |
| 6,624,494 B2* | 9/2003 | Blanchard et al. | 257/493 |
| 6,649,477 B2* | 11/2003 | Blanchard et al. | 438/268 |
| 6,762,455 B2* | 7/2004 | Oppermann et al. | 257/335 |
| 6,803,626 B2* | 10/2004 | Sapp et al. | 257/329 |
| 6,818,513 B2* | 11/2004 | Marchant | 438/270 |
| 7,091,533 B2* | 8/2006 | Tihanyi et al. | 257/256 |
| 7,436,023 B2* | 10/2008 | Hirler et al. | 257/328 |
| 2004/0043565 A1* | 3/2004 | Yamaguchi et al. | 438/268 |
| 2008/0067626 A1* | 3/2008 | Hirler et al. | 257/501 |
| 2008/0265320 A1* | 10/2008 | Mauder et al. | 257/341 |

FOREIGN PATENT DOCUMENTS

| | | |
|---|---|---|
| DE | 102005035153 A1 | 2/2007 |
| DE | 102005039331 A1 | 2/2007 |
| DE | 102006009942 A1 | 9/2007 |
| DE | 102006055742 A1 | 6/2008 |
| WO | 2007012490 A2 | 2/2007 |

\* cited by examiner

*Primary Examiner*—Anh D Mai
(74) *Attorney, Agent, or Firm*—Dicke, Billig & Czaja, PLLC

(57) ABSTRACT

Semiconductor component including a drift region and a drift control region. One embodiment provides a drift zone and a drift control zone. A drift control zone dielectric is arranged between the first drift zone and the drift control zone and has at least two sections arranged at a distance from one another in a current flow direction of the component. At least one separating structure is arranged between the drift zone and the drift control zone in the region of an interruption, defined by the at least two sections, of the drift control zone dielectric and has at least one PN junction.

21 Claims, 4 Drawing Sheets

SEMICONDUCTOR COMPONENT HAVING DISCONTINUOUS DRIFT ZONE CONTROL DIELECTRIC ARRANGED BETWEEN DRIFT ZONE AND DRIFT CONTROL ZONE AND A METHOD OF MAKING THE SAME

BACKGROUND

In the case of semiconductor components including a drift zone and a drift control zone arranged adjacent to the drift zone, the drift control zone being insulated from the drift zone by a dielectric layer, the drift control zone provides for the formation of an accumulation channel or an inversion channel along the dielectric layer—depending on the doping type of the drift zone—when driven in the on state. Given the same on resistance as a conventional component without such a drift control zone, the accumulation or inversion channel that forms when the component is driven in the on state enables a lower doping of the drift zone, and thus a higher dielectric strength, or the channel leads to a low on resistance given the same doping of the drift zone.

For realizing vertical components, that is to say those components in which, in the on state, a current flows in a vertical direction between a front side and a rear side of the semiconductor body, it is necessary to produce dielectric layers which extend in a vertical direction of the semiconductor body over the entire depth of the drift zone. In this case, the thickness of the dielectric layer, that is to say the dimension thereof in a horizontal direction, should be as small as possible in order to achieve a best possible accumulation or inversion effect. Such dielectric layers extending in a vertical direction can be produced by using a trench etch and subsequently filling the trench with a dielectric material. However, dielectric layers having a thickness of a few hundred nm such as are desirable for such components can be produced only to a limited depth by this method. Depending on the desired dielectric strength of the component, and thus depending on the dimension of the drift zone in a vertical direction, the depth may be insufficient to produce a dielectric layer along the entire dimension of the drift zone in a vertical direction.

A further method for producing such a component provides for etching a trench that is wider than the desired thickness of the dielectric layer, applying dielectric layers to the sidewalls of the trench, and then epitaxially filling the trench with a semiconductor material. However, this method is complicated and therefore cost-intensive.

SUMMARY

One aspect of the present description relates to a semiconductor component which can assume an on state and an off state and which includes: a drift zone, a drift control zone, a drift control zone dielectric arranged between the drift zone and the drift control zone and having at least two sections arranged at a distance from one another in a current flow direction of the component, and at least one separating structure which is arranged between the drift zone and the drift control zone in the region of an interruption—which is defined by the at least two sections—of the drift control zone dielectric and which has at least one pn junction.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
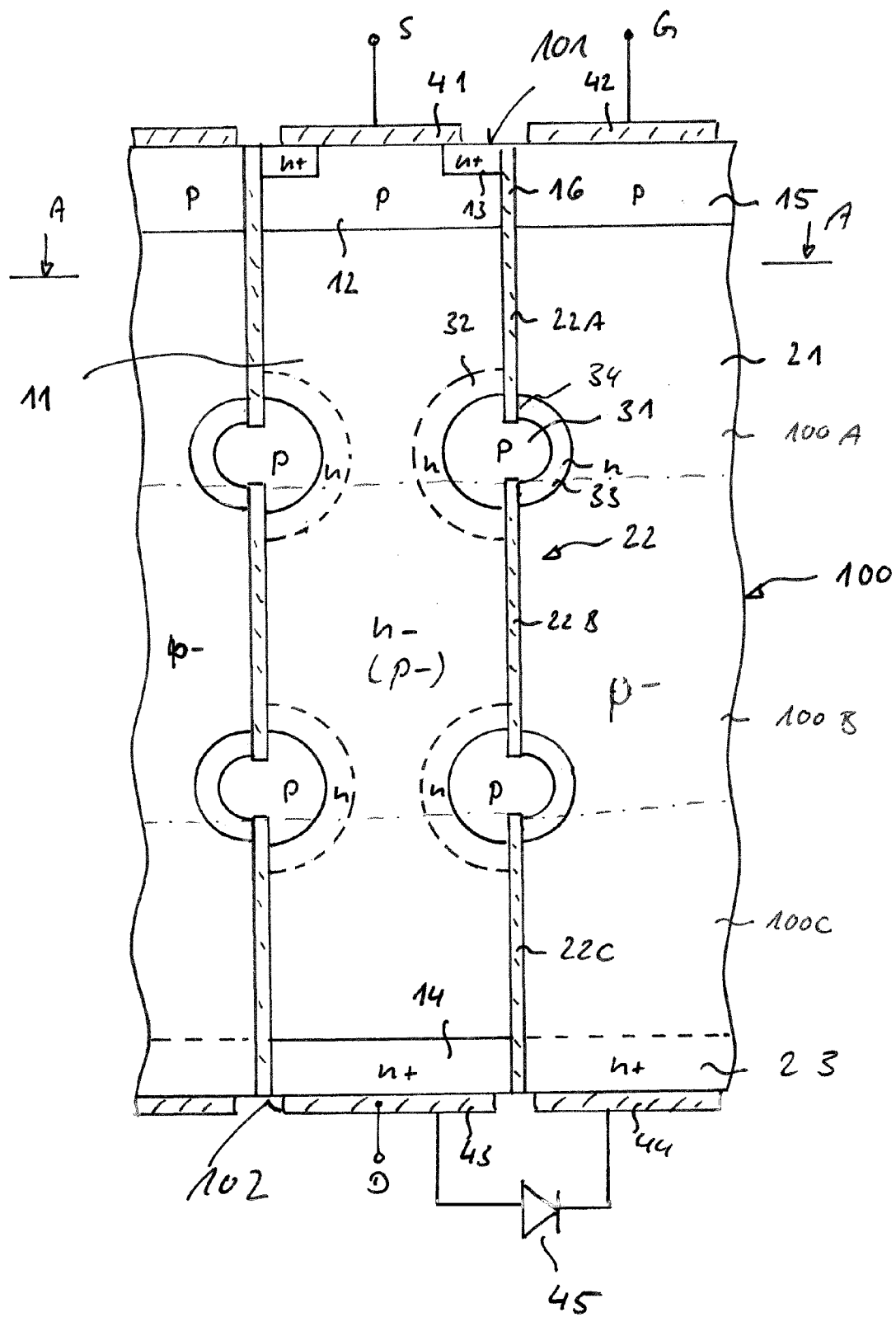
FIG. 1 illustrates an excerpt from a vertical cross section of a semiconductor component including a drift zone, a drift control zone, and, between the drift zone and the drift control zone, a drift control zone dielectric realized in a plurality of sections, and also separating structures.

FIG. 1 illustrates a vertical cross section through a semiconductor component in accordance with a first example. The semiconductor component includes a semiconductor body 100 having a first side 101, which is referred to hereinafter as front side, and a second side 102, which is referred to hereinafter as rear side. The semiconductor component illustrated is realized as a MOS transistor and has a drift zone 11 of a first conduction type, a body zone 12 of a second conduction type, which is complementary to the first conduction type, the body zone being adjacent to the drift zone 11, and also source zones 13 and a drain zone 14. The source zone 13 is separated from the drift zone 11 by the body zone 12 and, in the example illustrated, is of the same conduction type as the drift zone 11. The drain zone 14 is adjacent to the drift zone 11 at the opposite side to the body zone 12. In the embodiment of a transistor formed as a MOSFET, the drain zone 14 is of the same conduction type as the source zone 13.

In order to control an inversion channel in the body zone 12 between the source zone 13 and the drift zone 11, the component has a gate electrode 15, which is insulated from the source zone 13, the body zone 12 and the drift zone 11 by a gate dielectric 16.

Adjacent to the drift zone 11 there is a drift control zone 21 present, which is dielectrically insulated from the drift zone 11 by a drift control zone dielectric 22. In the component illustrated, the drift control zone dielectric 22 has a plurality of sections 22A, 22B, 22C arranged at a distance from one another in a current flow direction of the component. In the embodiment of the vertical component illustrated, the current flow direction corresponds to a vertical direction of the semiconductor body 100, that is to say a direction running perpendicular to the front side 101 and the rear side 102.

Realizing the drift control zone dielectric 22 in such a way that the latter has a plurality of sections arranged at a distance from one another facilitates the production of the drift control zone dielectric 22 in a manner explained below. Such a dielectric layer 22 can be produced by the region of the semiconductor body 100, in which the drift zone 11 and the drift control zone 21 are arranged being produced layer by layer. For this purpose, a plurality of semiconductor layers will be produced successively, the semiconductor layers being illustrated by dash-dotted lines in FIG. 1 and being designated by the reference symbols 100A, 100B, 100C. These individual layers are produced for example by epitaxial deposition of a semiconductor material forming the semiconductor body 100, such as e.g., silicon.

After the production of each semiconductor layer, a trench extending in a vertical direction is produced for each section of the dielectric layer 22, for example by selective or masked removal of the respective semiconductor layer by using an etching method. In this embodiment, the trenches to be produced extend over a depth corresponding maximally to the depth of the semiconductor layer deposited previously. In this embodiment, the layer thicknesses of the successively deposited semiconductor layers which predetermine the maximum depth of the trenches that are subsequently to be produced are chosen such that it is possible to produce very narrow trenches and having a trench width for example within the range of a few tens to a few hundreds of nanometers, which extend approximately over the entire thickness of the semiconductor layer deposited previously. The thickness of the semiconductor layer deposited previously lies for example within the range of between 10 µm and 30 µm. In this way it is possible to produce trenches having a high aspect ratio, that is to say a high ratio of depth to width, for example within the range of 50:1 to 200:1. Depending on the thickness of the deposited semiconductor layer, it is thereby possible to produce sections of the dielectric layer 22 whose dimensions in a current flow direction lie within the range of a few tens to a few hundreds of nanometers (a few 10 to a few 100 nm). In this embodiment, the width of the trenches determines the later thickness of the dielectric layer 22. In this embodiment, the "thickness" of the dielectric layer 22 should be understood to mean the dimension of the dielectric layer in a direction transversely with respect to the current flow direction and perpendicular to an area formed by the dielectric layer 22. The dielectric layer 22 is produced after the production of the individual trenches by filling the trenches with a dielectric material or by thermal oxidation of the semiconductor layer in the region of the trench.

In the embodiment of the component illustrated in FIG. 1, the bottommost section 22C—proceeding from the front side 101—of the dielectric layer 22 extends as far as the rear side 102 of the semiconductor body 100. This can be achieved for example by depositing a first 100C of the plurality of semiconductor layers onto a semiconductor substrate which in sections forms the later drain zone 14 of the component. In this embodiment, a first trench for producing the bottommost section 22C of the drift control zone dielectric 22 is produced such that it extends right into the semiconductor substrate. After producing the individual semiconductor layers 100A-100C and, if appropriate, after carrying out further method steps for the production of the component illustrated, the semiconductor substrate is removed proceeding from the opposite side to the semiconductor layers 100A-100C until the bottommost section 22C of the drift control zone dielectric is reached, whereby the structure illustrated in FIG. 1 is obtained.

In the embodiment of the component illustrated, the drift control zone 21 is doped complementarily to the drift zone 11, but the drift zone and the drift control zone 21 could also be of the same conduction type. The doping type of the drift zone that is indicated between parentheses in FIG. 1 relates to the latter configuration. The doping concentrations of the drift zone 11 and of the drift control zone 21 can lie within the same range and can be very low. The doping concentrations are for example less than $10^{16}$ cm$^{-3}$, and in one embodiment less than $10^{14}$ cm$^{-3}$.

It shall be assumed for the explanation below that the MOSFET illustrated is an n-conducting MOSFET. In this embodiment, the source zone 13 and the drain zone 14 are n-doped, and the body zone 12 is p-doped. Majority charge carriers are electrons in this embodiment. Independently of this, the drift zone 11 can be n-doped or p-doped. The explanations below also apply correspondingly to a p-conducting component, which is obtained from the n-conducting component explained by interchanging the doping types of the individual component zones.

In the embodiment of the component illustrated in FIG. 1, the drift control zone 21 is directly adjacent to the gate electrode 15. In this embodiment, the gate dielectric 16 of the gate electrode 15, which is arranged adjacent to the body zone 12 in a lateral direction, and the section 22A of the drift control zone dielectric that is arranged closest to the front side 101 can be formed by a common dielectric layer extending as far as the front side 101.

A task of the drift control zone 21 is to control a conducting channel for the majority charge carriers in the drift zone 11 along the drift control zone dielectric 22 when the component is driven in the on state. The component illustrated in FIG. 1 is driven in the on state when a positive voltage is present between a drain electrode 43 making contact with the drain zone 14, or a drain terminal D, and a source electrode 41 making contact with the source zone 14, or a source terminal, and when an electrical potential suitable for forming an inversion channel in the body zone 13 is present at the gate electrode 15.

The channel is an accumulation channel if the drift zone 11 is of the same conduction type as the source zone 13, that is to say if the drift zone 11 is n-doped in the embodiment of an n-conducting component, and the channel is an accumulation channel if the drift zone 11 is doped complementarily to the source zone 13, that is to say if the drift zone 11 is p-doped in the embodiment of an n-conducting component. The accumulation channel influences the on resistance of the component to the effect that a lower on resistance can be achieved given the same doping concentration of the drift zone as in a conventional component without a drift control zone, or that a lower doping of the drift zone 11 and thus a higher dielectric strength of the component can be achieved given the same on resistance as in a conventional component.

In the embodiment of the n-conducting component illustrated, in order to form such a channel along the drift control zone dielectric 22, the drift control zone 21 must assume an electrical potential that is higher than an electrical potential present in the drift zone 11 when the component is in the on state. Holes must therefore be accumulated in the drift control zone 21 at least along the drift control zone dielectric 22.

In the embodiment of the component illustrated in FIG. 1, such a higher potential of the drift control zone 21 is achieved by the drift control zone 21 being directly connected to the gate electrode 15, such that the drift control zone 21 is at the potential of the gate electrode 15 when the component is driven in the on state. A higher electrical potential of the gate electrode 15 by comparison with the source zone 14 or the drift zone 11 is required in order to drive the component in the on state, that is to say in order to generate a conducting channel in the body zone 12 between the source zone 13 and the drift zone 11. The gate electrode 15 is a p-doped semiconductor zone in this embodiment.

The drift control zone 21 is coupled to the drain zone 14 or to a drain electrode 43 that makes contact with the drain zone 14. In order to prevent a situation in which, when the component is driven in the on state, the charge carriers of the drift control zone 21 that bring about the higher electrical potential by comparison with the drift zone 11 flow away in a direction of the drain zone 14, a rectifier element 45, for example a diode, is connected between the drain zone 14 and the drift control zone 21. The rectifier element 45 can be an external component, for example, but can also be integrated—in a manner not illustrated in greater detail—in the semiconductor body. In the example illustrated, the rectifier element 45 is connected to a connecting electrode 44 that makes contact with the drift control zone 21. The rectifier element 45 is connected up such that it prevents a discharge of the drift control zone 21 in a direction of the drain zone 14 when the component is driven in the on state, that is to say that a potential equalization between the drift control zone 21 and the drain zone 14 is prevented when the component is driven in the on state. In the example illustrated, the rectifier element effects blocking if the drift control zone has an electrical potential that is higher than an electrical potential of the drain zone 14. In the embodiment of a p-conducting component (not illustrated), the rectifier element effects blocking if the drift control zone has an electrical potential that is lower than an electrical potential of the drain zone.

There is optionally arranged between the drift control zone 21 and the rectifier element 45 a semiconductor zone 23 that serves as a channel stopper zone and prevents the formation of a conducting channel—in the example: an inversion channel—along the drift control zone dielectric 22 for the charge carriers stored in the drift zone 21 under the control of the electrical potential of the drift zone 11 in the drift control zone 21. The charge carriers required for generating the higher potential of the drift control zone 21 are holes in the example illustrated. The channel stopper zone 23 is a highly n-doped semiconductor zone in this embodiment.

If the drift zone 11 is of the same conduction type as the body zone 12, then an inversion channel controlled by the drift control zone 21 forms along the drift control zone dielectric 22 when the component is driven in the on state. Since the drift control zone dielectric 22 has a plurality of sections arranged at a distance from one another, connecting zones 32 doped complementarily to the drift zone 11 are provided in this embodiment, the connecting zones extending in the drift zone 11 from one section of the drift control zone dielectric to the respective next section. In the embodiment of an n-doped drift zone 11, the connecting zones 32 are optionally present and then doped more highly than the drift zone 11.

In order to separate the drift zone 11 and the drift control zone 21, separating structures each having at least one pn junction are present in those regions in which the drift control zone dielectric 22 is interrupted, that is to say in regions between two sections of the drift control zone dielectric 22. The pn junction is polarized such that, when the component is driven in the on state, no potential equalization can take place between the drift zone 11 and the drift control zone 21, that is to say that no charge carrier flow can take place between the drift zone 11 and the drift control zone 21. For the component illustrated, the separating structures in each embodiment have a first separating zone 31 and a second separating zone 33 doped complementarily to the first separating zone 31, the zones forming a pn junction which extends from one section to the respective next section of the drift control zone dielectric 22 in a vertical direction. The pn junction thus extends over the entire cutout present between two sections of the drift control zone dielectric 22 and therefore completely separates the drift zone 11 and the drift control zone. The doping concentration of the first separating zone 31 lies for example in the region of $10^{17}$ cm$^{-3}$ or above. The doping concentration of the second separating zone 33 lies for example between $10^{15}$ cm$^{-3}$ and $10^{17}$ cm$^{-3}$. In the example illustrated, the second separating zone 33 is n-doped and faces the drift control zone 21, while the first separating zone 31 is p-doped and faces the drift zone 11. In the embodiment of a p-conducting component (not illustrated), these dopings are correspondingly interchanged.

The component illustrated is turned off if a positive voltage is present between drain and source but the gate electrode does not have an electrical potential suitable for forming an inversion channel in the body zone. When the component is driven in the off state, a space charge zone propagates in a vertical direction both in the drift zone and in the drift control zone 21. The doping of the drift control zone 21 is so low, for example between less than $10^{16}$ cm$^{-3}$ and even less than $10^{14}$ cm$^{-3}$, that the propagation of such a space charge zone is possible. It should also be noted in this context that the drift zone 11 and the drift control zone 21 are composed of a monocrystalline semiconductor material that enables such space charge zones to propagate.

The space charge zone that propagates in the drift control zone 21 when the component is in the off state reduces the voltage loading on the drift control zone dielectric 22, such that the drift control zone dielectric 22 can be made comparatively thin, for example with a thickness of at most 10 to 100 nm, which results in a good accumulation or inversion effect when the component is driven in the on state. When the component is driven in the off state, each of the first separating zones 31 acts as a compensation zone which compensates for dopant charges present in the associated second separating zone 33 and in the associated connecting zone 32. In this embodiment, the doping concentration of the first separating zones 31 can be so high that the separating zones 31 are not fully depleted when the component is driven in the off state.

When the component is driven in the off state, charge carriers flow into the first separating zones 31. In the embodiment of the p-doped first separating zones 31 illustrated in FIG. 1, these inflowing charge carriers are electrons, such that negatively charged acceptor cores arise and the first separating zones 31 are negatively charged. When the component is switched on again, that is to say upon the transition of the component from the off state to the on state, the separating zones have to be discharged by using the electrons flowing away, or by using holes flowing in. Otherwise, with the component in the on state, a space charge zone would be present around the second separating zones 31 in the drift zone 11 and would adversely influence the on resistance of the component. In order to achieve such a discharge, the separating structures have discharge structures. In the embodiment of the separating zones illustrated in the figure, such discharge structures are present on account of a particular geometry of the first and second separating zones 31, 33: the second separating zones 33 extend in the drift control zone 21 from one section of the drift control zone dielectric 22 as far as the respective next section of the drift control zone dielectric in a vertical direction. On the opposite side of at least one of these sections of the drift control zone dielectric 22, that is to say on the side of the drift zone 11, the first separating zone 31 extends as far as the drift control zone dielectric 22 and in this embodiment completely overlaps at least one of the sections of the second separating zone 33 that extends as far as the drift control zone dielectric 22. As a result of this, a discharge channel 34 is present in the second separating zone 33 along the drift control zone dielectric 22, which discharge channel is controllable by the first separating zone extending as far as the dielectric 22 at the opposite side of the dielectric 22.

The functioning of the discharge structure is explained below for an arbitrary one of the separating structures: if the potential of the drift control zone 21 rises when the component is switched on again and if the first separating zone 31 is initially at a lower electrical potential than the drift control zone 21 due to the holes that have flowed away previously, then the discharge channel becomes conducting under the control of the lower potential of the first separating zone 31, that is to say that an inversion channel forms along the drift control zone dielectric 22 in the second separating zone 33. Holes flow via the channel from the drift control zone 21 into the first separating zone, whereby the first separating zone 31 is discharged again.

It should also be pointed out that the first separating zone 31 can be doped so highly that it is not fully depleted in the off-state case, that is to say that not all of the dopant charge present in the separating zone is ionized.

The semiconductor component illustrated is constructed in cellular fashion and has a multiplicity of transistor cells of identical type each having a source zone 13, a body zone 12, a drift zone 11, a drift control zone 21 and a drift control zone dielectric 22 arranged between the drift zone 11 and the drift control zone 21, and also a gate electrode 15. The individual transistor cells are realized as strip cells, for example. In this embodiment, the component zones explained extend in elongated fashion in a direction running perpendicular to the plane of the drawing illustrated in FIG. 1. In this embodiment, the source zones 13 of the individual transistor cells are electrically conductively connected to one another, and the gate electrodes 15 of the individual transistor cells are electrically conductively connected to one another. Furthermore, the drain zones 14 of the individual transistor cells are electrically conductively connected to one another, whereby the individual transistor cells are connected in parallel. In the embodiment of the example illustrated in FIG. 1, two adjacent transistor cells respectively share a drift zone 11, and two further adjacent transistor cells respectively share a drift control zone 21.

Figure 2:
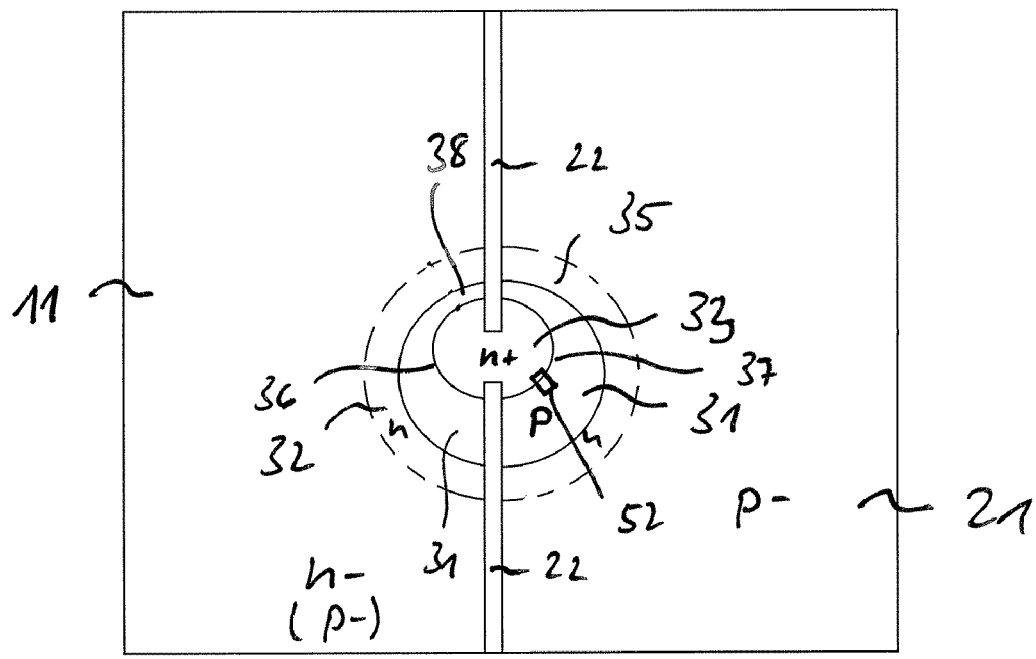
FIG. 2 illustrates a second example of a separating structure.

FIG. 2 illustrates a further example of a separating structure serving for separating the drift zone 11 and the drift control zone 21 in those regions of the semiconductor body 100 in which the drift control zone dielectric 22 is interrupted. In the embodiment of this separating structure, the second separating zone 33 extends from one section of the drift control zone dielectric 22 as far as the respective next section of the drift control zone dielectric 22 in a vertical direction and is completely surrounded by the first separating zone 31 both toward the drift zone 11 and toward the drift control zone 21. In this example embodiment, the first and second separating zones 31, 33 form two pn junctions, a first pn junction 36 toward the drift zone 11 and a second pn junction 37 toward the drift control zone 21. What is crucial for preventing a potential equalization between electrical potentials of the drift zone 11 and of the drift control zone 21 when the component is driven in the on state is in this embodiment the first pn junction 36, which is reverse-biased if the drift control zone 21 is at a higher electrical potential than the drift zone 11.

In the example illustrated, the first separating zone 31 has two partial sections, a first partial section arranged between the second separating zone 32 and the drift zone 11, and a second partial section arranged between the second drift zone 33 and the drift control zone 21. There is optionally the possibility that the second pn junction 37 formed between the second separating zone 33 and the second partial section is made ineffective by producing a short circuit 52 between the second separating zone 33 and the second partial section. For this purpose, by way of example a metal or a highly doped polycrystalline semiconductor material is introduced into the region of the pn junction.

The functioning of the separating structure illustrated in FIG. 2 is explained below: if the component is turned off, and if a space charge zone thus propagates in the drift zone 11 and the drift control zone 21, then a space charge zone propagates proceeding from the pn junction between the first separating zone 31 and the drift zone 11 or the connecting zone 32 optionally present. Dopant charges of the first separating zone and of a section of the drift zone 11 or of the connecting zone 32 thereby mutually compensate for one another. The first separating zone is charged as a result of this, or dopant atoms in the first separating zone are ionized. This "charging" of the first separating zone 31 corresponds to electrons flowing into the first separating zone 31. In the example illustrated, the second separating zone 33 is doped so highly that it is not fully depleted in the off-state case. The first partial zone 31 can be doped here such that it is not fully depleted in the off-state case. When the component is in the off state, the first separating zone 31 is charged negatively in the example illustrated by using holes flowing away or by using electrons flowing in. In this embodiment, the first separating zone 31 assumes an electrical potential corresponding to the electrical potential of the surrounding drift zone 11. In this embodiment, the second separating zone 33 assumes the electrical potential of the first separating zone 31.

A discharge structure is realized in the embodiment of the separating structure illustrated in FIG. 2 by virtue of the fact that the second separating zone 33 is arranged in sections so close to the first separating zone 31 that a breakdown structure 38 arises, which enables a discharge of the second separating zone 33 in a direction of the drift zone 11 if a potential difference between the electrical potential of the drift zone 11 and the second separating zone 33 corresponds to the value of a breakdown voltage of the breakdown structure. With the discharge of the second separating zone 33, the first separating zone 31 surrounding the second separating zone 33 is also discharged again. In this embodiment, the breakdown structure 38 is arranged at a location at which a potential difference between the electrical potential of the drift zone 11 and the second separating zone 33 is lowest when the component is in the off state. In the present embodiment this is equivalent to the breakdown structure 38 being arranged in that region of the first and second partial zones 31, 33 which lies closest to the pn junction formed between the drift zone 11 and the body zone (12 in FIG. 1).

Figure 3:
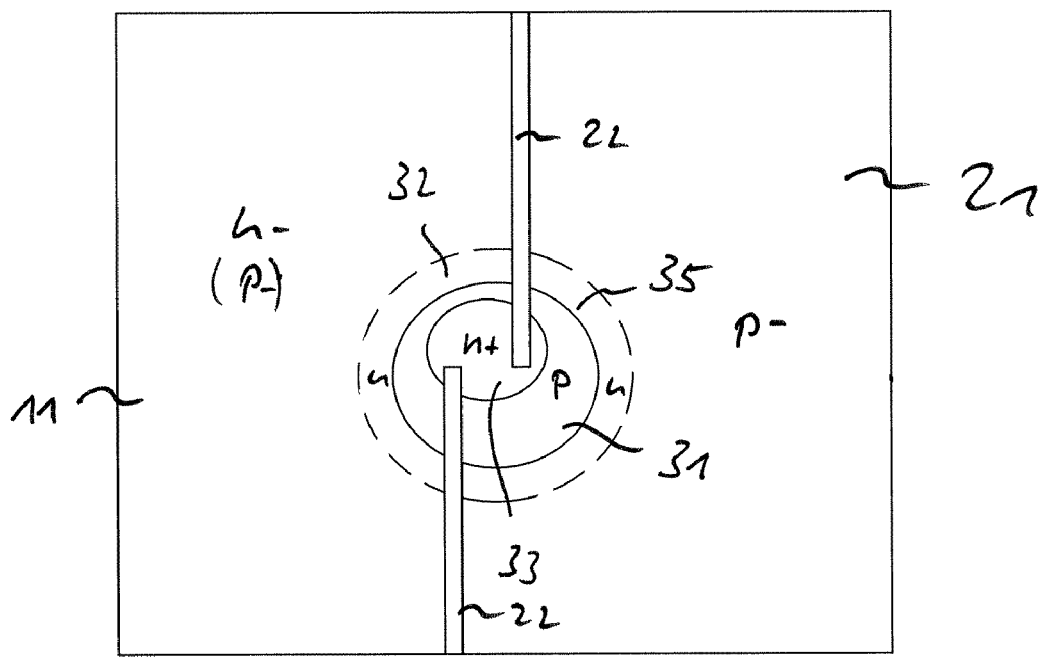
FIG. 3 illustrates a third example of a separating structure.

Referring to FIG. 3 it should be pointed out that the individual sections of the drift control zone dielectric 22 need not necessarily be arranged in alignment in a vertical direction of the semiconductor body 100. FIG. 3 illustrates an excerpt from a cross section through the semiconductor body in the region of a separating structure. In this embodiment, the sections of the dielectric layer which are arranged adjacent to one another in the region of this separating structure are arranged offset with respect to one another in a lateral direction of the semiconductor body. The separating structure illustrated in FIG. 3 corresponds to the separating structure already explained with reference to FIG. 2. It goes without saying, however, that a lateral offset of the individual sections of the dielectric layer is permissible in any of the separating structures that have been explained above and will be explained below.

Figure 4:
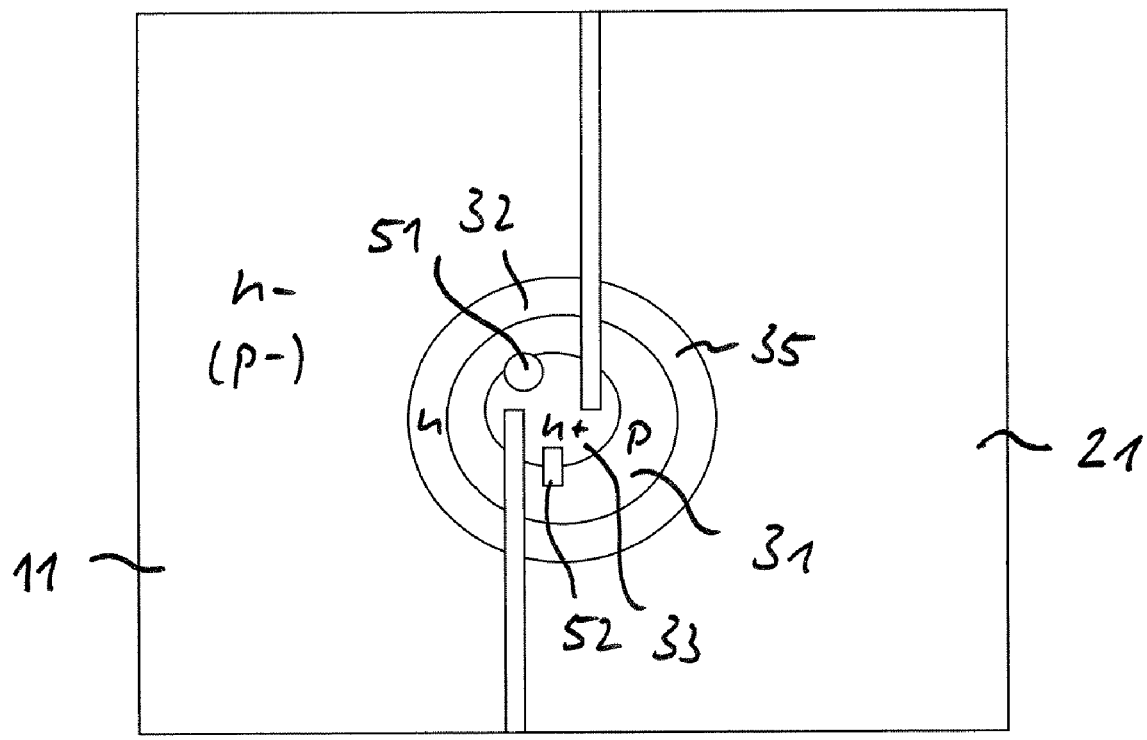
FIG. 4 illustrates a fourth example of a separating structure.

FIG. 4 illustrates a further example embodiment of a separating structure, which differs from that illustrated in FIG. 2 by virtue of the fact that a breakdown zone 51 of the same conduction type as the second separating zone 33 is present. The breakdown zone is arranged partly in the second separating zone 33 and is realized in such a way that it extends proceeding from the second separating zone 33 further in a direction of the drift zone 11 than the second separating zone 33. In this embodiment, the breakdown zone 51 or the distance between the breakdown zone 51 and the drift zone 11 or the connecting zone 32 (if one is present) determines the breakdown voltage of the breakdown structure. The doping concentration of the breakdown zone 51 may correspond to the doping concentration of the second separating zone 33.

In the embodiment of the component illustrated in FIG. 1, the drift control zone 21 is directly adjacent to the gate electrode 15, whereby the drift control zone 21 is at the electrical potential of the gate electrode 15 when the component is driven in the on state. The above-explained concept of realizing the drift control zone dielectric in such a way that it has a plurality of sections (22A to 22C in FIG. 1) arranged at a distance from one another in a current flow direction can, however, be applied to any component structures of a semiconductor component including a drift zone 11 with a drift control zone 21.

Figure 5:
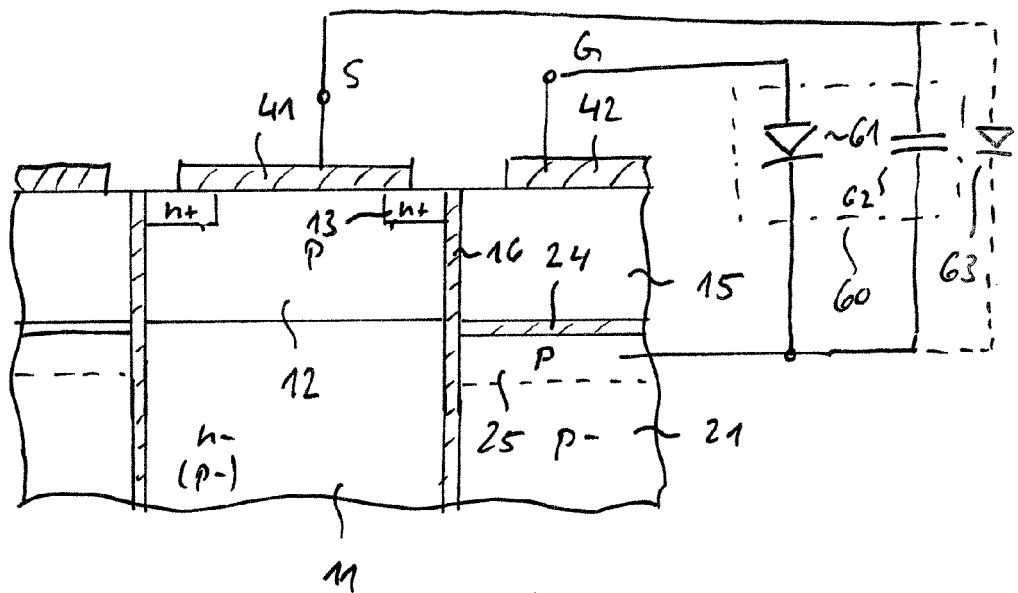
FIG. 5 illustrates an excerpt from a vertical cross section through a semiconductor component in which a gate electrode and the drift control zone are arranged in a manner separated from one another.

FIG. 5 illustrates an excerpt from a cross section through a semiconductor component in which the drift control zone 21 is insulated from the gate electrode 15 by a dielectric layer 24. A charging circuit 60 is connected to the drift control zone 21 in the example illustrated, the charging circuit being designed to charge the drift control zone 21, when the component is driven in the on state, to an electrical potential suitable for forming the desired conducting channel in the drift zone 11 along the drift control zone dielectric 22.

In the example illustrated, the charging circuit 60 includes a first rectifier element 61, in one embodiment a diode, which is connected between the gate terminal G and the drift control zone 21. Optionally, a capacitive charge store 62, for example a capacitor, is present, which is connected between the drift control zone 21 and the source electrode S. When the component is driven in the off state, the charge store 62 serves for storing the charge carriers that were stored in the drift control zone 21 when the component was previously driven in the on state. When such a charge store 62 is provided, switching losses that arise when the component is switched on and off can be considerably reduced. Optionally, a further rectifier element 63, for example a diode, is connected in parallel with the charge store element 62 between the source terminal S and the drift control zone 21. For connecting the charging circuit 60, the drift control zone 21 has a more highly doped connecting zone 25, for example, which can be of the same conduction type as the drift control zone 21.

Figure 6:
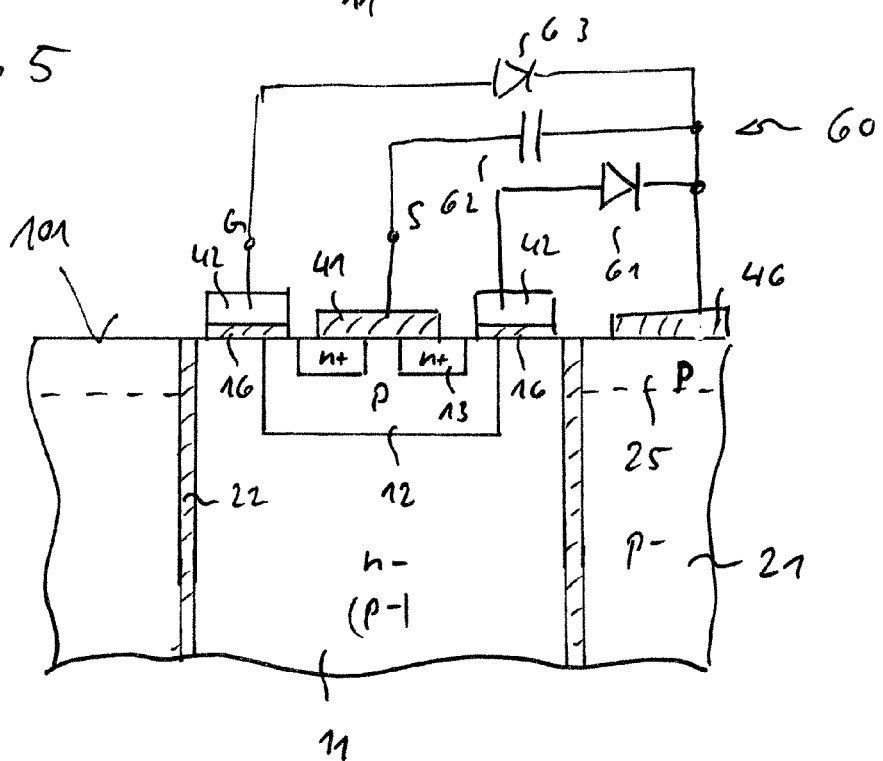
FIG. 6 illustrates an excerpt from a vertical cross section through a semiconductor component with a planar gate electrode.

FIG. 6 illustrates an excerpt from a further semiconductor component in cross section. In this embodiment, the gate electrode 42 is realized as a planar electrode and arranged above the front side 101 of the semiconductor body. In this embodiment, the body zone 12 does not extend as far as the drift control zone dielectric 22 in a lateral direction of the semiconductor body.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor component which can assume an on state and an off state comprising:
   a drift zone;
   a drift control zone;
   a drift control zone dielectric arranged between the drift zone and the drift control zone and having at least two sections arranged at a distance from one another in a current flow direction of the component; and
   at least one separating structure which is arranged between the drift zone and the drift control zone in the region of an interruption, which is defined by the at least two sections, of the drift control zone dielectric and which has at least one pn junction.

2. The semiconductor component of claim 1, comprising wherein the at least one pn junction is polarized such that it prevents a potential equalization between the drift zone and the drift control zone in the on state of the semiconductor component.

3. A semiconductor component configured to have an on state and an off state comprising:
   a drift zone;
   a drift control zone;
   a drift control zone dielectric arranged between the drift zone and the drift control zone and having at least two sections arranged at a distance from one another in a current flow direction of the component; and
   at least one separating structure which is arranged between the drift zone and the drift control zone in the region of an interruption, which is defined by the at least two sections, of the drift control zone dielectric and which has at least one pn junction, wherein the separating structure has a first separating zone and a second separating zone doped complementarily to the first separating zone, between which zones the at least one pn junction is formed.

4. The semiconductor component of claim 3, comprising wherein the first and second separating zones in each case extend from one section of the drift control zone dielectric as far as a section adjacent to said one section in a current flow direction.

5. The semiconductor component of claim 4, comprising wherein the second separating zone is arranged between the first separating zone and the drift control zone.

6. The semiconductor component of claim 4, comprising wherein the first separating zone surrounds the second separating zone toward the drift zone and toward the drift control zone.

7. The semiconductor component of claim 3, comprising wherein the separating structure has a discharge structure for the first separating zone.

8. The semiconductor component of claim 7, comprising wherein the discharge structure is designed to enable a charge exchange between the first separating zone and the drift zone or the drift control zone when the component is in the on state.

9. The semiconductor component of claim 8, comprising wherein the discharge structure has a discharge channel which can be controlled by the first separating zone and which extends along at least one section of the drift control zone dielectric through the second separating zone from the drift control zone to the first separating zone.

10. The semiconductor component of claim 9, comprising:
wherein the second separating zone is adjacent to the at least one of the sections of the drift control zone dielectric at a side facing the drift control zone, and
wherein the first separating zone is adjacent to the at least one of the sections of the drift control zone dielectric at a side facing the drift zone and completely overlaps the second separating zone along said section.

11. The semiconductor component of claim 6, comprising:
wherein the first separating zone has a first partial section which is arranged between the second separating zone and the drift zone and which forms a first PN junction with the second separating zone, and
wherein the first separating zone has a second partial section which is arranged between the second separating zone and the drift control zone and which forms a second PN junction with the second separating zone.

12. The semiconductor component of claim 11, comprising wherein the second separating zone and the second partial section are short-circuited.

13. The semiconductor component of claim 11, comprising wherein a distance between the second separating zone and the drift zone is reduced locally, whereby a discharge structure is formed.

14. A semiconductor component configured to have an on state and an off state comprising:
a drift zone;
a drift control zone;
a drift control zone dielectric arranged between the drift zone and the drift control zone and having at least two sections arranged at a distance from one another in a current flow direction of the component; and
at least one separating structure which is arranged between the drift zone and the drift control zone in the region of an interruption, which is defined by the at least two sections, of the drift control zone dielectric and which has at least one pn junction,
wherein the semiconductor component is a MOSFET and comprising a source zone, a body zone arranged between the source zone and the drift zone, and a drain zone separated from the body zone by the drift zone, and a gate electrode adjacent to the body zone and dielectrically insulated from the body zone by a gate dielectric.

15. The semiconductor component of claim 14, comprising wherein the gate electrode is composed of a doped semiconductor material and is directly adjacent to the drift control zone.

16. The semiconductor component of claim 14, comprising wherein a rectifier element is arranged between the drain zone and the drift control zone, said rectifier element being connected up in such a way that no potential equalization takes place between the drain zone and the drift control zone when the component is driven in the on state.

17. The semiconductor component of claim 14, comprising wherein the drift control zone is arranged in a manner separated from the gate electrode and which has a charging circuit connected to the gate electrode.

18. The semiconductor component of claim 17, comprising wherein the charging circuit has a rectifier element connected between the gate electrode and the drift control zone.

19. A semiconductor component which can assume an on state and an off state comprising:
a drift zone;
a drift control zone;
a drift control zone dielectric arranged between the drift zone and the drift control zone and having at least two sections arranged at a distance from one another in a current flow direction of the component; and
means for separating arranged between the drift zone and the drift control zone in the region of an interruption, which is defined by the at least two sections, of the drift control zone dielectric and which has at least one pn junction.

20. A method of making a semiconductor component comprising:
forming a drift zone;
forming a drift control zone;
arranging a drift control zone dielectric between the drift zone and the drift control zone and having at least two sections arranged at a distance from one another in a current flow direction of the component; and
configuring at least one separating structure between the drift zone and the drift control zone in the region of an interruption, which is defined by the at least two sections, of the drift control zone dielectric and which has at least one pn junction.

21. The method of claim 20, comprising polarizing the at least one pn junction such that it prevents a potential equalization between the drift zone and the drift control zone in the on state of the semiconductor component.

* * * * *